(12) United States Patent
Miyake

(10) Patent No.: US 7,436,490 B2
(45) Date of Patent: Oct. 14, 2008

(54) EXPOSURE APPARATUS USING BLAZE TYPE DIFFRACTION GRATING TO DIFFRACT EUV LIGHT AND DEVICE MANUFACTURING METHOD USING THE EXPOSURE APPARATUS

(75) Inventor: Akira Miyake, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 248 days.

(21) Appl. No.: 11/103,041

(22) Filed: Apr. 11, 2005

(65) Prior Publication Data
US 2005/0236585 A1   Oct. 27, 2005

(30) Foreign Application Priority Data
Apr. 12, 2004  (JP)  ............................. 2004-116805

(51) Int. Cl.
*G03B 27/72* (2006.01)
*G02B 3/08* (2006.01)
(52) U.S. Cl. ..................... 355/71; 356/328; 359/571
(58) Field of Classification Search .................. 355/67, 355/71, 53; 356/328; 359/571
See application file for complete search history.

(56) References Cited

U.S. PATENT DOCUMENTS 6,469,827 B1 * 10/2002 Sweatt et al. ............... 359/351
6,825,988 B2 * 11/2004 Bristol ....................... 359/634
2002/0097385 A1    7/2002 Van Elp et al.
2004/0051954 A1    3/2004 Bristol
2004/0075830 A1 *  4/2004 Miyake et al. ............. 356/328

FOREIGN PATENT DOCUMENTS

JP          1-175736 A       7/1989

OTHER PUBLICATIONS

A European Search Report dated Nov. 27, 2007 for the corresponding European Patent Application No. 05252272.9-1226.

* cited by examiner

*Primary Examiner*—Peter B Kim
*Assistant Examiner*—Chia-how Michael Liu
(74) *Attorney, Agent, or Firm*—Morgan & Finnegan, LLP

(57) ABSTRACT

This invention generally relates to an exposure apparatus and an exposure method using EUV light. In one preferred form of the present invention, the exposure apparatus is arranged to expose a substrate to a pattern of an original by use of extreme ultraviolet light, and it includes a blaze type diffraction grating disposed so that light from a plasma light source is incident thereon, and an optical system for directing extreme ultraviolet light from the blaze type diffraction grating to at least one of the original and the substrate.

9 Claims, 13 Drawing Sheets

INFRARED LIGHT

EUV LIGHT

EXPOSURE APPARATUS USING BLAZE TYPE DIFFRACTION GRATING TO DIFFRACT EUV LIGHT AND DEVICE MANUFACTURING METHOD USING THE EXPOSURE APPARATUS

FIELD OF THE INVENTION AND RELATED ART

This invention relates to an exposure apparatus and an exposure method usable in a lithographic process which is one process among device manufacturing processes for producing semiconductor devices or liquid crystal devices, for example. More particularly, the invention concerns EUV exposure apparatus and EUV exposure method wherein EUV (extreme ultraviolet) light is used as an exposure wavelength.

Conventionally, the lithographic (printing) process for production of very fine semiconductor devices such as semiconductor memories or logic circuits is carried out on the basis of reduction projection exposure using ultraviolet light.

The smallest size that can be transferred by the reduction projection exposure is proportional to the wavelength of light used, and it is inversely proportional to the numerical aperture of the projection optical system used. Hence, shortening the wavelength of light used for transferring a very fine circuit pattern has been attempted, shorter and shorter wavelengths of ultraviolet light have been used such as from Hg lamp i-line (wavelength 365 nm) to KrF excimer laser (wavelength 248 nm) and then to ArF excimer laser (wavelength 193 nm).

However, semiconductor devices are being miniaturized in size very quickly, and there are limits in the lithography using ultraviolet light. Accordingly, in order to enable efficient printing of extraordinarily fine circuit patterns less than 0.1 µm, reduction projection exposure apparatuses using extreme ultraviolet (EUV) light having a wavelength of about 10-15 nm, much shorter than ultraviolet rays, are being developed.

FIG. 12 is a schematic view of a known type reduction projection exposure apparatus using EUV light. In this projection exposure apparatus, EUV light emitted from a light source is used to project a pattern of a reticle R onto a wafer W in a reduced scale.

The light source for producing EUV light may comprise a laser plasma light source, for example. In such light source, a large intensity pulse laser light is projected a target material placed in a vacuum container, whereby high-temperature plasma is produced. EUV light having a wavelength of about 13 nm, for example, is emitted from the plasma, and it is used. As regards the target material, a metal thin film, an inactive gas or liquid drops is used, for example, and it is supplied into the vacuum container by means of gas jet, for example. In order to obtain high average intensity of EUV light emitted, use of higher repetition frequency of the pulse laser is preferable and, generally, the laser is operated at a repetition frequency of few kHz.

As regards an optical system for directing exposure light from the light source to the wafer, since absorption by substance is very large in the EUV light region, a lens optical system having been used with visible light or ultraviolet region is impractical and so a catoptric system for directing exposure light with a combination of plural reflection type optical elements is used.

The reflection type optical elements constituting such catoptric system may include a multilayered film mirror and an oblique incidence total reflection mirror. The oblique incidence total reflection mirror can be used only in the case of large incidence angle, and the optical design freedom is small. It is therefore difficult to introduce it into a projection optical system. The multilayered film mirror is therefore used in a projection optical system, in many cases. Japanese Laid-Open Patent Application, Publication No. 1-175736 proposes an example of multilayered film mirror structure, wherein two materials having different refractive indices are alternately accumulated to provide a multilayered laminated film that can reflect EUV light.

The multilayered film mirror can be made by alternately accumulating two substances having different optical constants, and it may be used even with perpendicular (normal) incidence having an incidence angle of zero deg. The substances that constitute the layers may be molybdenum (Mo) and silicon (Si), for example. Regarding the layer thickness, the molybdenum layer may have a thickness of about 0.2 nm and the silicon layer may have a thickness of about 0.5 nm, for example. The number of accumulated layers may be twenty pairs, for example. The total thickness defined by adding the layer thicknesses of the two substances is called "film period". In the example disclosed in the aforementioned patent document, the film period is 0.2 nm+0.5 nm=0.7 nm.

If the surface roughness at the interface between the molybdenum layer and the silicon layer is large, as a buffering layer for compensating the surface roughness, a boron carbide ($B_4C$) layer, for example, may be provided between them.

When EUV light is incident on such multilayered film mirror and if the incidence angle is θ, the wavelength of EUV light is λ and the film period is d, only such EUV light that has a narrow bandwidth of about 0.6 to 1 nm around the wavelength λ, and approximately that satisfies a relationship of Bragg's equation as equation (1) below can be reflected efficiently.

$$2 \times d \times \cos \theta = \lambda \tag{1}$$

On the other hand, multilayered film mirrors for use with EUV light have a characteristic such as described below.

FIG. 14 illustrates wavelength dependency of a multilayered film mirror, made by a combination of molybdenum and silicon, with respect to the reflectance in single reflection and the total reflectance in twelve times reflections.

A plasma EUV light source emits light rays of a wide range of wavelengths including ultraviolet rays, visible rays, infrared rays, for example, not only EUV light. It is seen from FIG. 14 that the reflectance of multilayered film mirror with respect to single reflection of EUV light of a wavelength of about 13.5 nm is about 70% at the best, whereas the reflectance to infrared rays or ultraviolet rays is large and, particularly, that for the infrared rays is almost 100%.

This means that, through reflection with ten or more multilayered film mirrors generally used in an EUV exposure apparatus, not only EUV light of a wavelength of about 13.5 nm emitted from a light source but also ultraviolet rays of a wavelength of about 100-300 nm and infrared rays of a wavelength of not shorter than 1000 nm can reach a reticle or a wafer, with almost no loss of light quantity.

Since the infrared rays incident on the wafer are small in photon energy and they would not sensitize a resist. However, the infrared rays or ultraviolet rays impinging on the reticle or the wafer are absorbed by the reticle or wafer, and it cause thermal expansion. This is one factor that prevents improvements of transfer pattern overlay precision.

In order to intercept infrared rays or ultraviolet rays that may cause thermal expansion of the reticle or wafer, as an attempt, a filter having a bandpass characteristic effective to pass only the wavelength of EUV light may be used. For effective transmission of EUV light, since EUV light is easily absorbed by a substance, a very thin zirconium film filter of a thickness of about 100 nm, for example, may be used. However, if such filter is used and a large power light emitted from an EUV light source is projected on such thin film filter, since the heat conductivity in the surface of the filter is small, the filter temperature would undesirably become very high due to the energy of light absorbed by the filter.

SUMMARY OF THE INVENTION

It is accordingly an object of the present invention to provide an exposure apparatus and/or an exposure method using EUV light, by which at least one of the inconveniences described above can be solved or reduced.

In accordance with an aspect of the present invention, there is provided an exposure apparatus for exposing a substrate to a pattern of an original by use of extreme ultraviolet light, said apparatus comprising: a blaze type diffraction grating disposed so that light from a plasma light source is incident thereon; and an optical system for directing extreme ultraviolet light from said blaze type diffraction grating to at least one of the original and the substrate.

In accordance with another aspect of the present invention, there is provided a device manufacturing method, comprising the steps of:

exposing a substrate to a pattern of an original by use of an exposure apparatus; and developing the exposed substrate; wherein the exposure apparatus is arranged to expose the substrate by use of extreme ultraviolet light and wherein the exposure apparatus includes a blaze type diffraction grating disposed so that light from a plasma light source is incident thereon, and an optical system for directing extreme ultraviolet light from the blaze type diffraction grating to at least one of the original and the substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings. Particularly, some embodiments will be described with reference to separation of EUV light from any other unwanted light such as infrared rays, for example, contained in light form an EUV light source, for preventing such unwanted light from reaching a reticle or a wafer.

Figure 1:
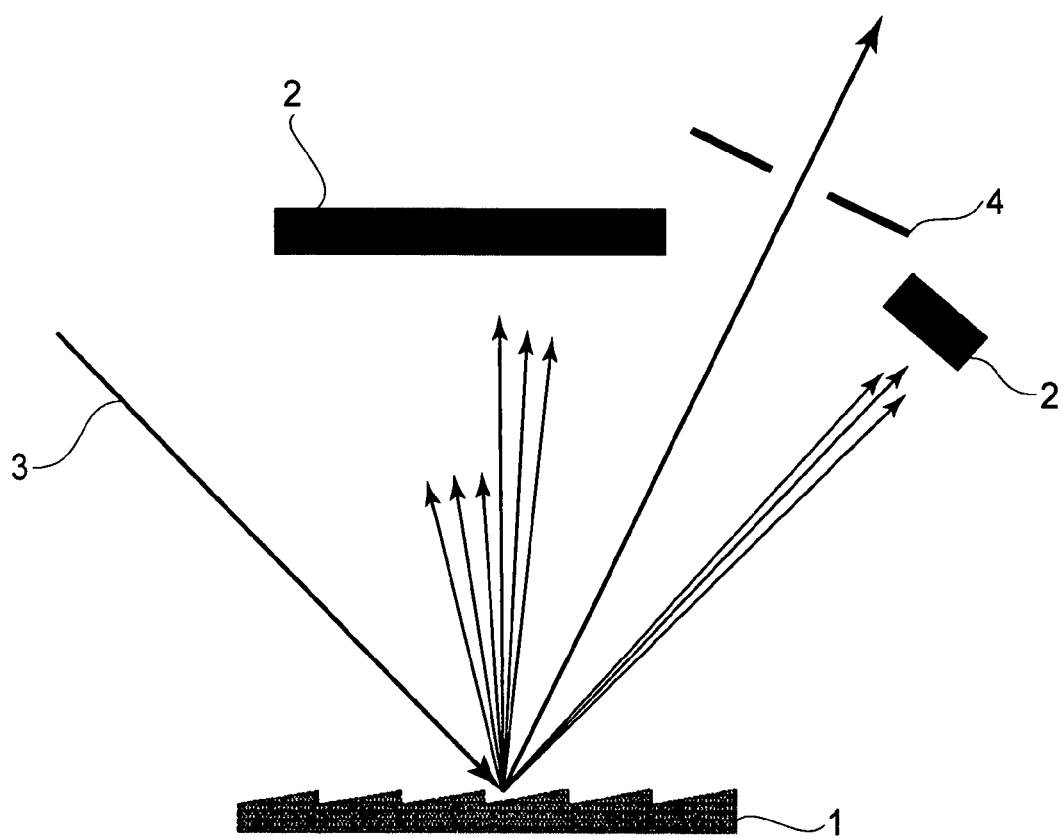
FIG. 1 is a schematic view for explaining the principle of separating EUV light and unwanted light in accordance with the present invention.

FIG. 1 is a schematic view for explaining the principle of separating EUV light from any other unwanted light, in accordance with a first embodiment of the present invention. In this embodiment, a blaze type diffraction grating 1 is used to spatially separate EUV light and any other unwanted lights. As will be described later in detail, the blaze type diffraction grating 1 can produce diffraction light in a direction which differs in dependence upon the wavelength of light rays incident thereupon, on the basis of which EUV light and unwanted infrared rays or ultraviolet rays can be separated from each other.

Figure 2:
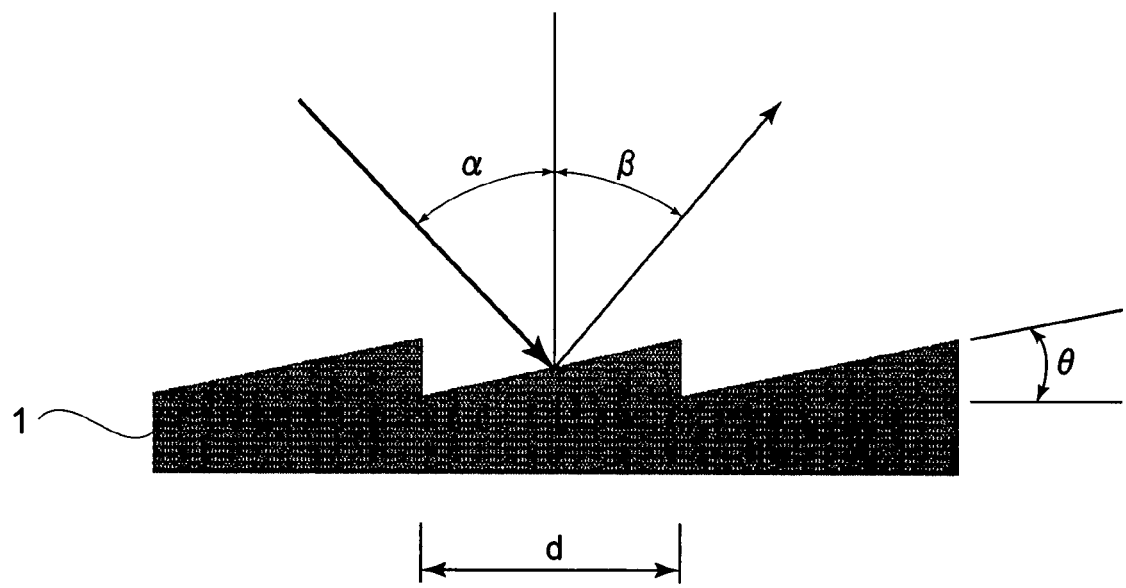
FIG. 2 is an enlarged schematic and sectional view of a blaze type diffraction grating used in the present invention.

FIG. 2 is an enlarged schematic and sectional view of a blaze type diffraction grating used in this embodiment. Here, as shown in the drawing, the groove pitch of the diffraction grating 1 is d, the incidence angle of light incident thereon is $\alpha$, the emission angle of diffracted light is $\beta$, the blaze angle is $\theta$, and the wavelength of light incident is $\lambda$. Among these parameters, a relationship expressed by equation (2) below is present.

$$d \times (\cos \beta - \cos \theta) = m \times \lambda \quad (2)$$

In equation (2), m is the order of diffraction and it takes an integral number. Also, the blaze condition can be expressed by equation (3) blow, and the strength of diffraction with order or orders approximately satisfying the condition of equation (3) becomes large.

$$\alpha - \beta = 2 \times \theta \quad (3)$$

Figure 3A:
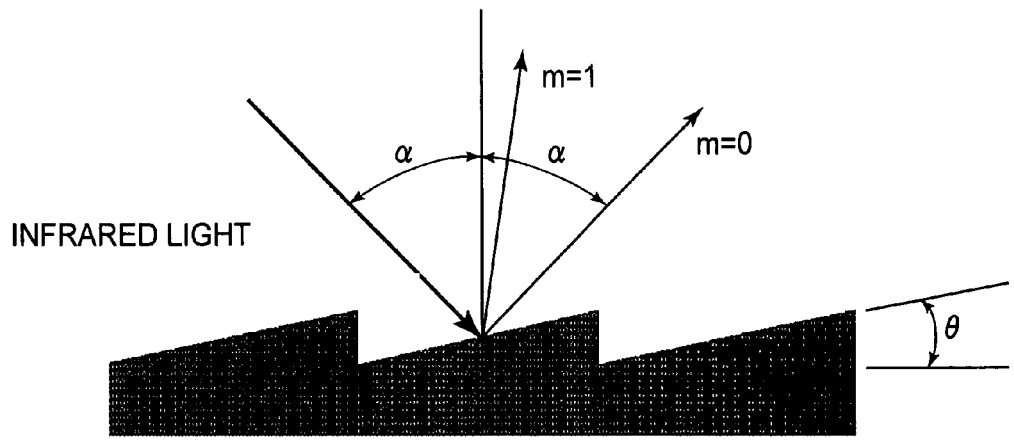
FIGS. 3A and 3B are schematic views, respectively, for explaining the principle of separating EUV light and infrared or ultraviolet light by use of a blaze type diffraction grating according to the present invention.
Figure 3B:
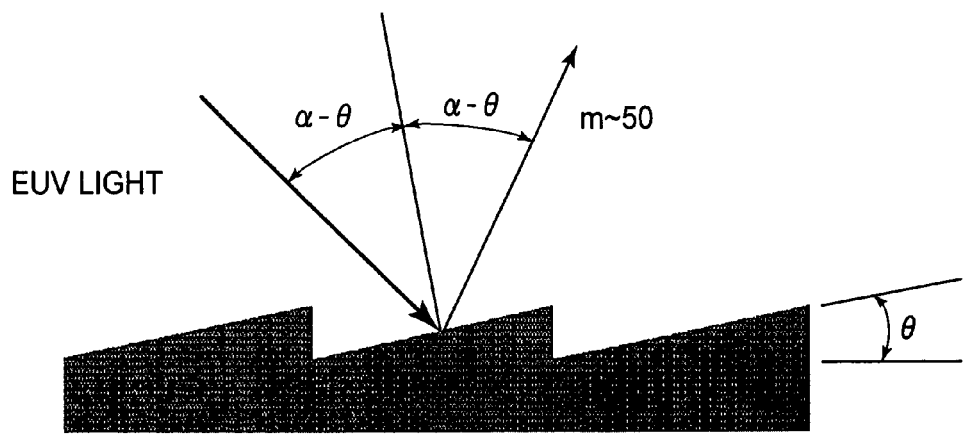

FIGS. 3A and 3B are schematic views, respectively, for explaining the principle of separating EUV light and infrared rays or ultraviolet rays by using a blaze diffraction grating of the present invention.

In preferred blaze type diffraction gratings used in the present invention, the blaze angle $\theta$ is set so that, in a wavelength region from infrared to ultraviolet, particularly the strength of diffraction of orders from m=0 to m=1 become strong. If EUV light having a wavelength which is about 1/100 of that of infrared rays or ultraviolet rays is incident on the diffraction grating, being set as described above, at the same angle, the result would be that, because of the effect of the blaze suggested by equation (3), diffraction lights of orders around m=50 would become strong.

Hence, by using a blaze type diffraction grating being set as described above and by setting the groove pitch d and etc. of the diffraction grating so that the direction of diffraction with orders from m=0 to m=1 with respect to the infrared rays or ultraviolet rays and the direction of diffraction of orders of about m=50 with respect to EUV light are made different from each other, the EUV light and any other unwanted light can be spatially separated from each other.

Regarding unwanted light rays separated from the EUV light, it is effective to intercept them by using light absorbing members 2 (FIG. 1) for absorbing light directed in a direction other than the diffraction direction of the EUV light. In place of using such light ray absorbing members, a reflection mirror for reflecting infrared rays may be used to collect infrared rays toward a particular direction and an infrared ray absorbing member may be provided there to absorb the collected infrared rays. There is a possibility that the temperature of such infrared ray absorbing member rises due to absorption of infrared rays to cause damage of the absorbing member or, in some cases, the absorbing member itself emits infrared rays through thermal radiation. In consideration of this, cooling means such as water cooling may preferably be provided to cool the infrared ray absorbing member.

Furthermore, there is a possibility that infrared rays are scattered and emitted from an infrared ray or ultraviolet ray absorbing member or from an infrared ray reflection mirror. Hence, an aperture member 4 effective to block such scattered light may preferably be provided to further reduce impingement of infrared rays upon the wafer.

Figure 4:
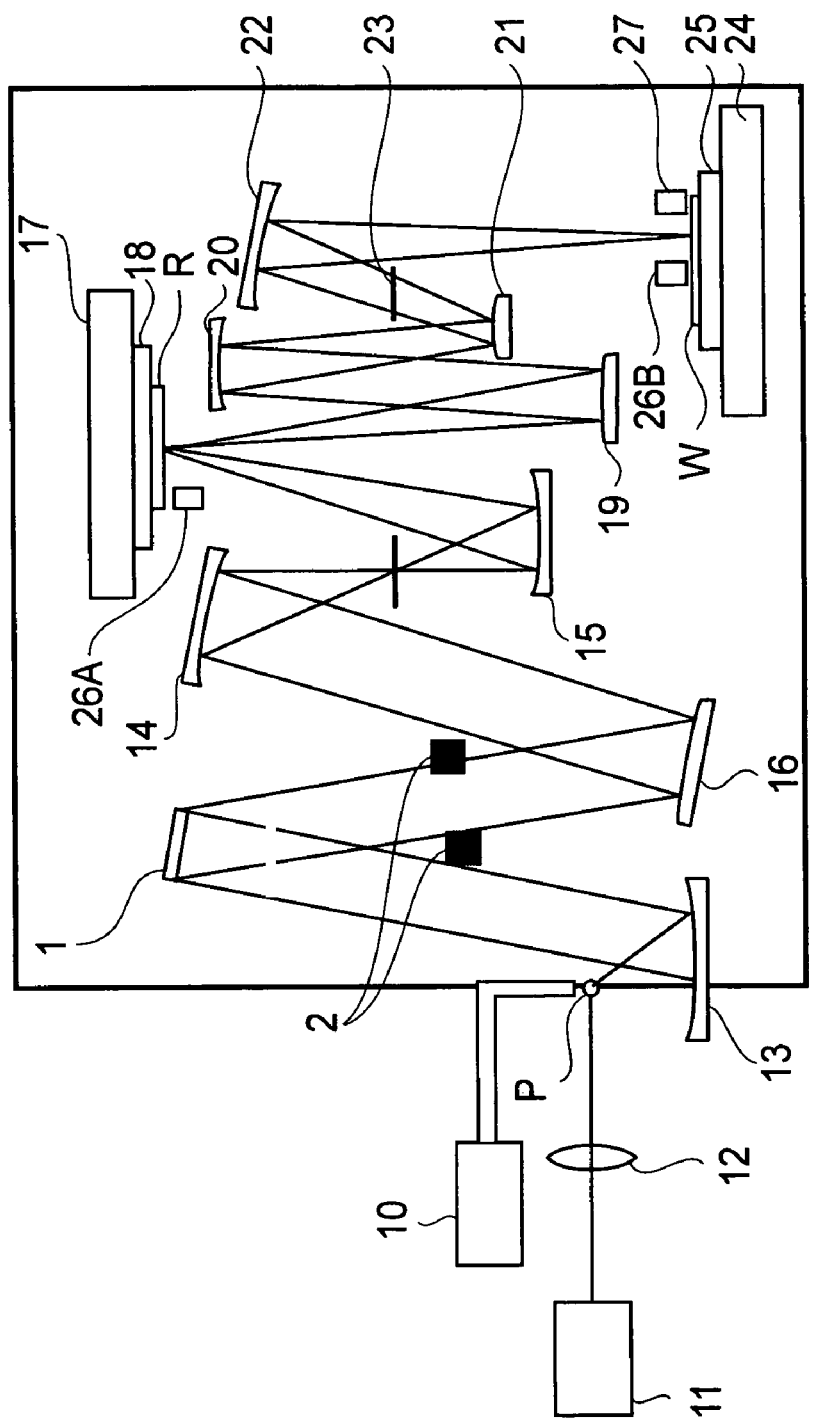
FIG. 4 is a schematic view of a main portion of an EUV exposure apparatus according to a first embodiment of the present invention.

FIG. 4 is a schematic view of a main portion of an EUV exposure apparatus according to an embodiment of the present invention. The EUV exposure apparatus of this embodiment is a reduction projection exposure apparatus for projecting a circuit pattern formed on a reticle onto a wafer in a reduced scale.

Next, referring to FIG. 4, the EUV exposure apparatus of this embodiment will be described in detail.

The EUV light source that produces EUV light has a structure that laser light emitted from a pulse laser 11 is collected by a condenser lens 12 onto a target being supplied by a target supplying device 10. In response to laser projection against the target material, a plasma P that contains EUV light is produced. Light emitted from the plasma P enters an illumination optical system of the exposure apparatus. The illumination optical system comprises first to third mirrors 13-15 each of which may be a multilayered film mirror or an oblique incidence mirror, and an optical integrator 16. The illumination optical system serves to direct the light, emitted from the produced plasma P, toward a reticle R which is fixedly held on a reticle stage 17 by means of a reticle chuck 18, to thereby illuminate the reticle. The optical integrator 16 has a function for illuminating the reticle R uniformly with a predetermined numerical aperture. Furthermore, there is an aperture member provided at a position inside the illumination optical system, which position is optically conjugate with the reticle R, so as to determine an illumination region upon the reticle surface.

The reticle R of this embodiment may be a reflection type reticle in which a pattern to be transferred is formed by an absorptive material provided on a mirror.

The light reflected by the reticle is directed toward a wafer W by means of a projection optical system that comprises first to fourth mirrors 19-22, each comprising a multilayered film mirror, and an opening restricting aperture 23. The wafer W is held fixed at a predetermined position on a wafer stage 24 by means of a wafer chuck 25.

The multilayered film mirror for EUV is larger in loss of light quantity than mirrors used for visible light. Hence, the smaller the number of mirrors used to constitute a projection optical system is, the smaller the amount of attenuation of EUV light is. On the other hand, however, correction of aberration becomes difficult to accomplish. The number of mirrors necessary for aberration correction is about four to six. The shape of each mirror reflection surface is spherical (convex or concave) or aspherical. The numerical aperture NA is about 0.1 to 0.2.

In order to attain a wide exposure region with a smaller number of mirrors, only a narrow arcuate region (ring-like field) spaced by a predetermined distance from the optical axis may be used, and the reticle and the wafer may be simultaneously scanningly moved to expose a wide area (this is called "scan exposure").

Figure 13:
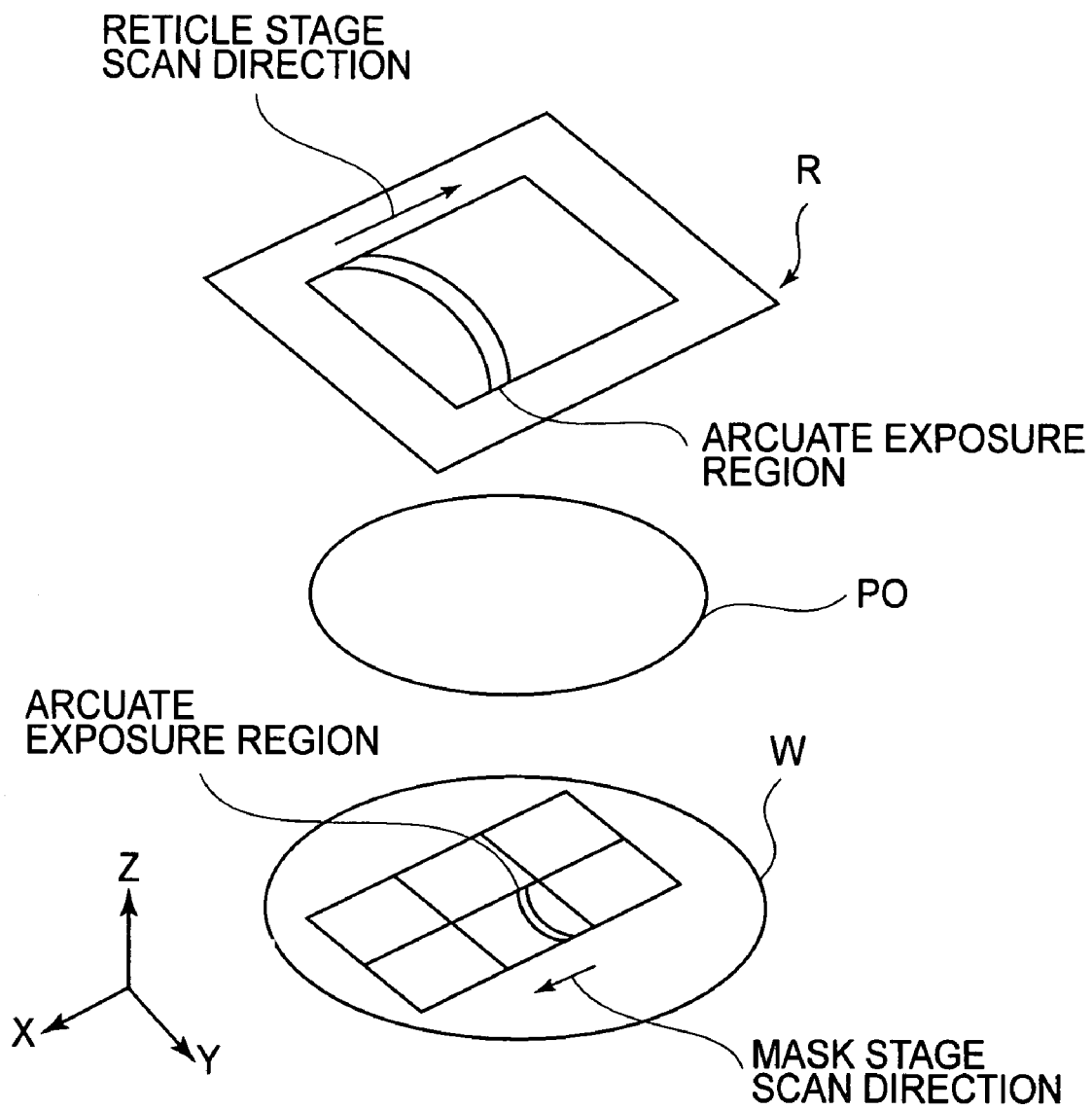
FIG. 13 is a schematic view for explaining the operation of a reticle stage and a wafer stage.
Figure 14:
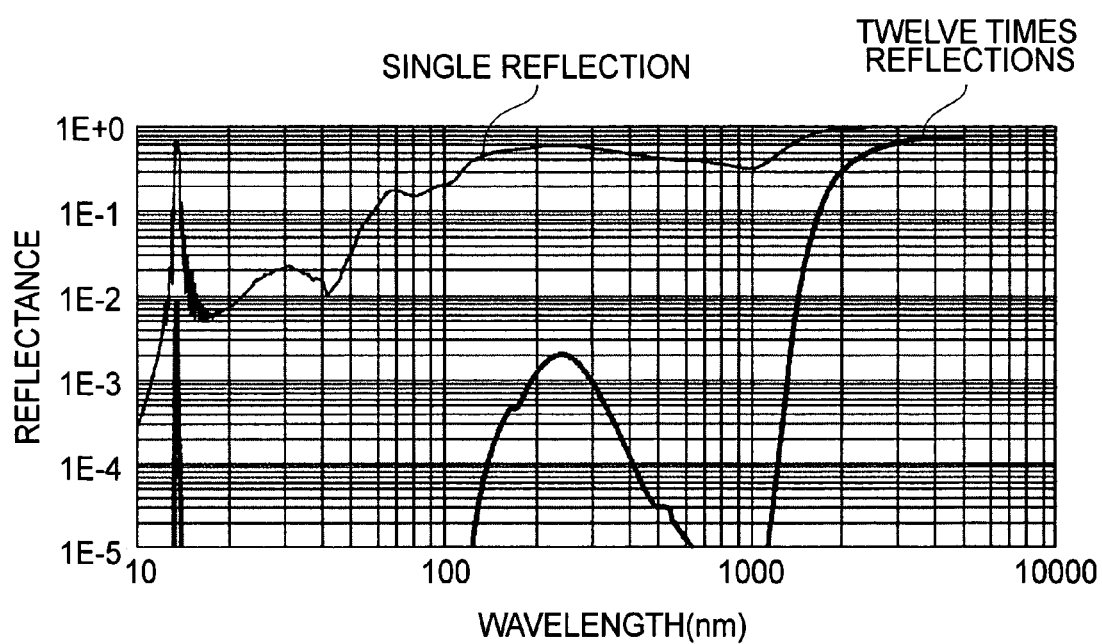
FIG. 14 is a graph for explaining wavelength dependency of the reflectance of a multilayered film mirror.

FIG. 13 is a schematic view for explaining the operation of a reticle stage and a wafer stage. The reticle stage and the wafer stage include a mechanism for scanningly moving them at a speed ratio corresponding to a reduction magnification. Here, the scan direction along the reticle or wafer surface is taken as X, a direction perpendicular to it is taken as Y, and a direction perpendicular to the reticle or wafer surface is taken as Z.

The reticle stage has a mechanism for moving it at high speed in X direction. Furthermore, the reticle stage includes fine-motion mechanisms with respect to X, Y and Z directions as well as rotational directions of about them, and it functions to position the reticle R precisely. The position and attitude of the reticle stage is measured by means of laser interferometers (not shown), and the position and attitude of the reticle stage are controlled on the basis of the results of measurements.

The wafer stage has a mechanism for moving it at high speed in X direction, similarly to the reticle stage. Furthermore, the wafer stage includes fine-motion mechanisms with respect to X, Y and Z directions as well as rotational directions of about them, and it functions to position the wafer W precisely. The position and attitude of the wafer stage is measured by means of laser interferometers (not shown), and the position and attitude of the reticle stage are controlled on the basis of the results of measurements.

If a single scan exposure is completed upon the wafer, the wafer stage moves stepwise in X and Y directions toward a subsequent scan exposure start position, and then the reticle stage and the wafer stage are synchronously scanningly moved again in X direction at a speed ration corresponding to the reduction magnification of the projection optical system.

In this manner, the operation that the reticle and the wafer are synchronously scanned while a reduced and projected image of the reticle is being imaged on the projection optical system O and the wafer, is repeated. This is called "step-and-scan". With this procedure, a pattern of the reticle is transferred to the whole wafer surface.

Alignment detection mechanism measures the positional relationship between the reticle position and the optical axis of the projection optical system by use of an alignment scope 26A, as well as the positional relationship between the wafer position and the optical axis of the projection optical system by use of another alignment scope 26B. On the basis of the measurements, the position and angle of each of the reticle stage and the wafer stage are set so that the projected image of the reticle is registered with a predetermined position on the wafer.

Focus position detecting mechanism 27 measures the focus position of the wafer surface with respect to Z direction and, by controlling the position and angle of the wafer stage, the wafer surface can be held at the imaging position of the projection optical system continuously during the exposure process.

In order to avoid absorption of EUV light by gas molecules, the space from the EUV light source to the wafer position is accommodated within a vacuum container 100 being evacuated by vacuum exhausting means, not shown.

The structure of the EUV exposure is not limited to what described above. Particularly, the laser plasma light source used in this embodiment may be replaced by a discharge type plasma light source.

Where a plasma light source is used as EUV light source, in addition to EUV light necessary for the exposure, various light rays of a wide wavelength region such as ultraviolet rays, visible rays and infrared rays are emitted therefrom. Among these light rays, the infrared rays are reflected almost by 100% by means of multilayered film mirrors, for example, that constitute an optical system, and they reach a reticle or a wafer and heat the same. As a result, the reticle or the wafer is expanded to cause an undesirable decrease of positional precision (overlay precision) for transfer of a pattern of the reticle onto the wafer.

In order to avoid such inconveniences, in this embodiment, a blaze type diffraction grating 1 and an infrared ray absorbing member 2 are provided between an illumination system first mirror 13 and an optical integrator 16.

In accordance with the blaze type diffraction grating used in this embodiment, by setting the width of each grating surface about 1000 times the wavelength of EUV light, the angular expansion due to diffraction of EUV light reflected at each surface can be made sufficiently small. Thus, it can function to advance the EUV light approximately in a direction of mirror surface reflection (specular reflection) to the blaze surface.

As a result of this, diffraction light of the EUV light is diffracted into between the zero-th order diffraction light and the first order diffraction light of the infrared rays or ultraviolet rays. Hence, the EUV light and the infrared rays or ultraviolet rays can be spatially separated from each other. Those light rays other than EUV light required for the exposure can therefore be absorbed by the infrared ray absorbing member 2, provided around the light path of EUV light, such that impingement of unwanted rays other than EUV light upon the wafer can be prevented effectively.

Particularly, in this embodiment, plasma light from the EUV light source is incident on the blaze type diffraction grating at an angle close to normal, to separate the EUV light and unwanted light rays from each other. Hence, the groove pitch d of the blaze type diffraction grating used in this embodiment is set at 10 μm, and the blaze angle is set at 2 degrees. Furthermore, in order to improve the reflectance to EUV light at each diffraction grating surface, a multilayered film comprising alternate layers of molybdenum and silicon is provided on the grating surface.

Figure 5:
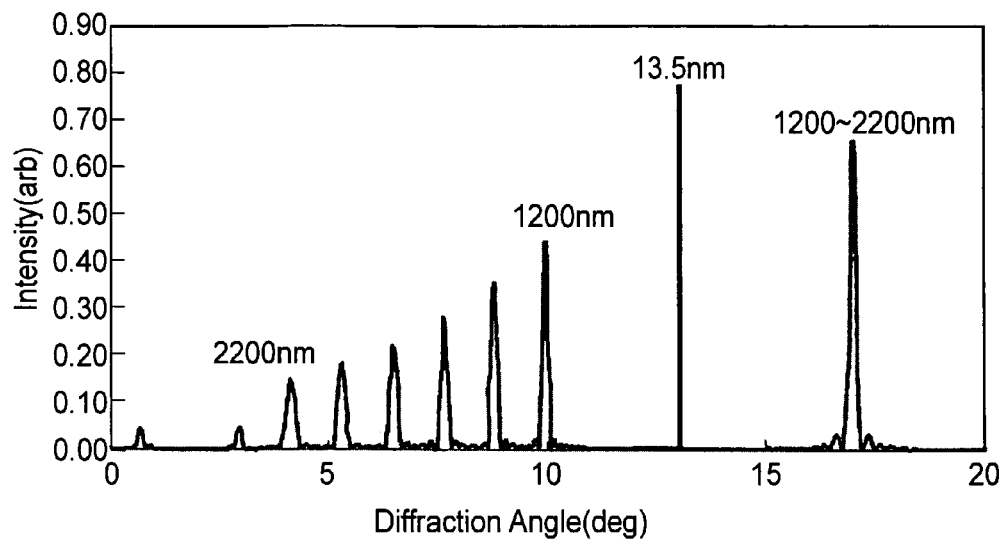
FIG. 5 is a graph for explaining angular distribution of diffraction light produced by a blaze type diffraction grating according to the first embodiment of the present invention.

FIG. 5 illustrates the results of calculation made in regard to the angular distribution of diffraction light in a case where light that comprises a mixture of EUV light having a wavelength 13.5 nm and infrared rays of a wavelength 1200-2200 nm, is projected on the diffraction grating used in this embodiment. It is seen from FIG. 5 that the EUV light of 13.5 nm wavelength is diffracted at an emission angle of about 13 deg. This corresponds to a diffraction order of about 50th. On the other hand, the infrared rays of 1200-2200 nm wavelengths are diffracted concentratedly with emission angles of 17 deg. and 4 to 10 deg. The former corresponds to zero-th order diffraction, while the latter corresponds to first order diffraction. Thus, with the diffraction grating used in this embodiment, the EUV light necessary for the exposure is diffracted in a direction of an emission angle 13 deg., whereas unwanted infrared rays unnecessary for the exposure are diffracted with emission angles of 17 deg. and 4-10 deg., and as a result, the EUV light can be separated from unwanted light rays from the EUV light source.

The unwanted light such as infrared rays as being separated from the EUV light in the manner described above is then absorbed by an infrared ray absorbing member that is provided around the EUV light diffracted by the blaze type diffraction grating, and it does not reach the reticle or wafer any more.

The blaze type diffraction grating usable in the EUV exposure apparatus of this embodiment is not limited to one having the parameters such as described above. Only required is that the EUV light can be diffracted concentratedly at an angle or angles different from those of the infrared rays. More preferably, the infrared rays or ultraviolet rays are made concentrated to zero-th and first orders, while the EUV light is made concentrated to an angle or angles between these orders. Since the wavelength of EUV light is about 1/50 to 1/500 of the wavelength of infrared rays or ultraviolet rays, the diffraction order of the EUV light may preferably be a half of it, that is, from 25th to 250th.

The optimum groove ditch d and blaze angle θ of the blaze type diffraction grating are variable in dependence upon the wavelength of light to be separated. Therefore, if necessary, a plurality of blaze type diffraction gratings may be provided along the light path, so that exactly only a predetermined EUV light can be extracted thereby precisely.

Next, another embodiment of the present invention will be explained. In this (second) embodiment, the invention will be described with reference to an example wherein a blaze type diffraction grating different from that of the first embodiment is introduced into an EUV exposure apparatus of a similar structure as that shown in FIG. 4.

In the EUV exposure apparatus of this embodiment, plasma light from an EUV light source is incident on a blaze type diffraction grating at an angle close to normal, to separate EUV light and unwanted light rays from each other. The groove pitch d of the diffraction grating used here is 1.25 μm, and the blaze angle is 2 degrees. Furthermore, in order to improve the reflectance to EUV light at the diffraction grating surface, a multilayered film mainly consisting of molybdenum and silicon is provided on the grating surface.

Figure 6:
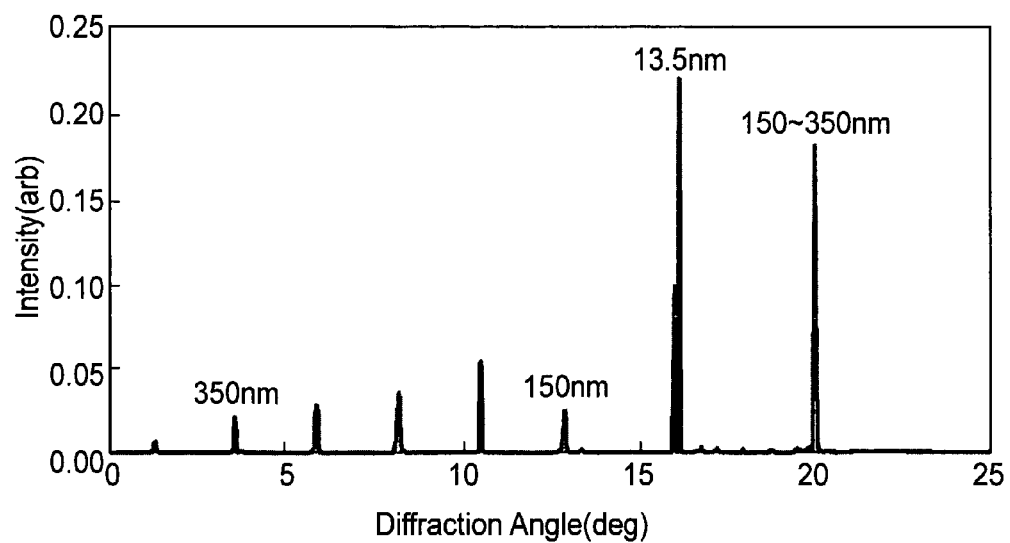
FIG. 6 is a graph for explaining angular distribution of diffraction light produced by a blaze type diffraction grating according to a second embodiment of the present invention.

FIG. 6 illustrates the results of calculation made in regard to the angular distribution of diffraction light in a case where light that comprises a mixture of EUV light having a wavelength 13.5 nm. and ultraviolet rays of a wavelength 150-350 nm, is projected on the diffraction grating used in this embodiment. It is seen from FIG. 6 that the EUV light of 13.5 nm wavelength is diffracted at an angle of about 16 deg. This corresponds to a diffraction order of about sixth. On the other hand, the ultraviolet rays of 150-350 nm wavelengths are concentrated to angles of 20 deg. and 3 to 13 deg. The former corresponds to zero-th order diffraction, while the latter corresponds to first order diffraction. Thus, with the diffraction grating used in this embodiment, the EUV light necessary for the exposure is diffracted in a direction of an angle of 16 deg., whereas unwanted infrared or ultraviolet rays unnecessary for the exposure are diffracted with angles of 20 deg. and 3-13 deg.

Like the first embodiment, a light absorbing member may be provided to absorb and intercept those light rays directed in directions other than the direction in which the EUV light is diffracted. In place of using such light absorbing member, a reflection mirror for reflecting ultraviolet rays may be used to direct the ultraviolet rays toward a particular direction and an ultraviolet ray absorbing member may be provided there to absorb the collected ultraviolet rays. There is a possibility that the temperature of such ultraviolet ray absorbing member rises due to absorption of ultraviolet rays to cause damage of the absorbing member or, in some cases, the absorbing member itself emits infrared rays through thermal radiation. In consideration of this, cooling means such as water cooling may preferably be provided to cool the ultraviolet ray absorbing member.

Furthermore, there is a possibility that ultraviolet rays are scattered and emitted from an ultraviolet ray absorbing member or from an ultraviolet ray reflection mirror. Hence, an aperture member effective to block such scattered light may preferably be provided to further reduce impingement of ultraviolet rays on the wafer.

The blaze type diffraction grating usable in the EUV exposure apparatus of this embodiment is not limited to one having the parameters such as described above. Only required is that the EUV light can be diffracted concentratedly at an angle or angles different from those of the infrared rays. More preferably, the ultraviolet rays are made concentrated to zero-th and first orders, while the EUV light is made concentrated to an angle or angles between these orders. Since the wavelength of EUV light is about 1/8 to 1/40 of the wavelength of ultraviolet rays, the diffraction order of the EUV light may preferably be a half of it, that is, from fourth to twentieth.

Figure 7:
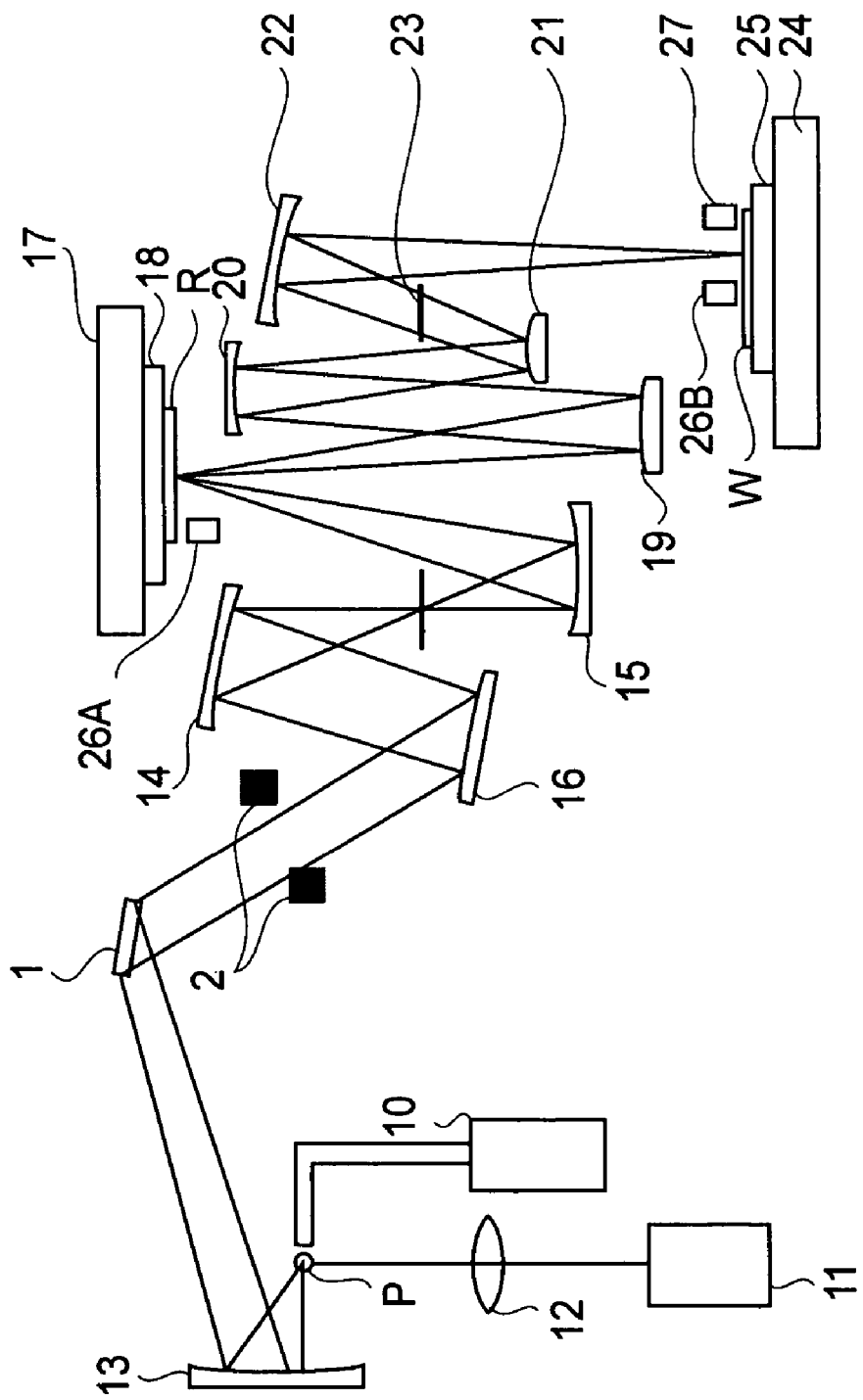
FIG. 7 is a schematic view of a main portion of an EUV exposure apparatus according to a third embodiment of the present invention.

Next, a further embodiment of the present invention will be described. FIG. 7 is a schematic view of a main portion of an EUV exposure apparatus according to a third embodiment of the present invention. In FIG. 7, structural components corresponding to those of the EUV exposure apparatus shown in FIG. 4 are denoted by like numerals. In the first embodiment, plasma light from an EUV light source is incident at an angle close to normal, whereas in the third embodiment of FIG. 7, oblique incidence with an incidence angle of about 80 deg. is adopted.

In the wavelength region of EUV light, the absorption of light by a substance is very large and, therefore, generally no reflection occurs at the surface of the substance. However, if the light is incident by oblique incidence with an incidence angle close to 90 deg., utilizing that the real part of the refractive index is slightly smaller than 1, total reflection may occur. Generally, through oblique incidence with an angle of a few degrees as measured from the reflection surface, a large reflectance more than few tens percent is obtainable.

The EUV exposure apparatus of this embodiment utilizes this principle, and a blaze diffraction grating of oblique incidence type with an incidence angle of about 80 deg. is used to separate the EUV light and unwanted infrared rays. Here, the diffraction grating groove pitch d is 40 μm, and the blaze angle is 2 deg.

For improved reflectance of the diffraction grating surface to the EUV light, a reflection film made of one of metals of gold, platinum, molybdenum, ruthenium and rhodium, or an alloy of any ones of them, is provided on the grating surface.

Figure 8:
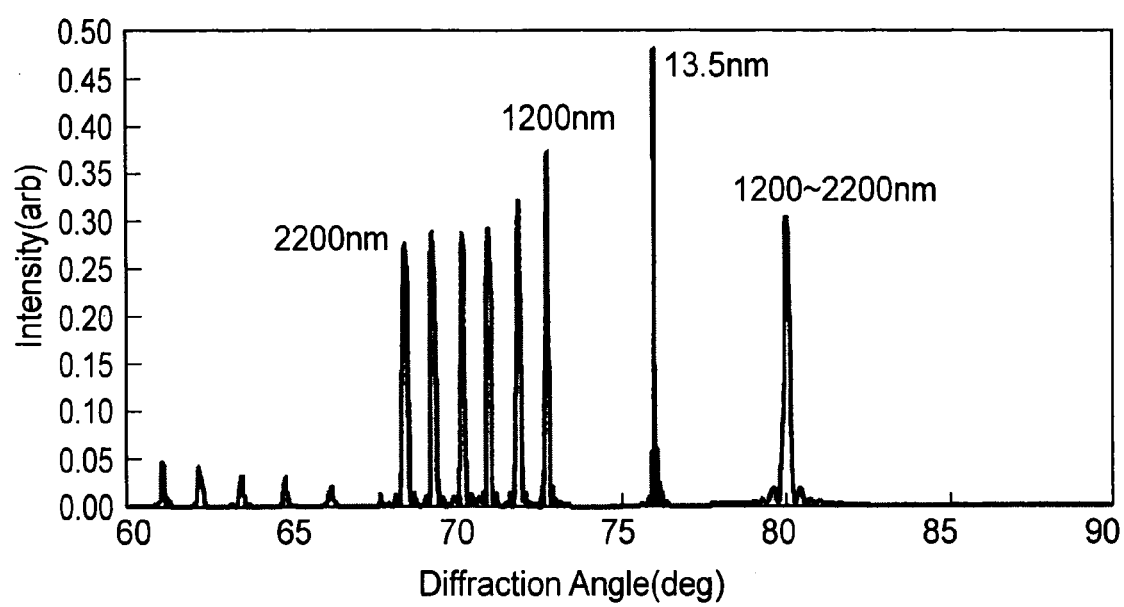
FIG. 8 is a graph for explaining angular distribution of diffraction light produced by a blaze type diffraction grating according to the third embodiment of the present invention.

FIG. 8 illustrates the results of calculation made in regard to the angular distribution of diffraction light in a case where light that comprises a mixture of EUV light having a wavelength 13.5 nm and infrared rays of a wavelength 1200-2200 nm, is projected on the diffraction grating used in this embodiment. It is seen from FIG. 8 that the EUV light of 13.5 nm wavelength is diffracted with an angle of about 76 deg. This corresponds to a diffraction order of about 43rd. On the other hand, the infrared rays of 1200-2200 nm wavelengths are concentrated to angles of 80 deg. and 66 to 73 deg. The former corresponds to zero-th order diffraction, while the latter corresponds to first order diffraction. Thus, with the diffraction grating used in this embodiment, the EUV light necessary for the exposure is diffracted in a direction of an angle 76 deg., whereas unwanted infrared rays unnecessary for the exposure are diffracted in directions of angles of 80 deg. and 66-73 deg., and as a result, the EUV light can be separated from unwanted light rays from the EUV light source. Furthermore, in this embodiment like the first embodiment, an infrared ray absorbing member or the like may be used to intercept the unwanted infrared rays.

The blaze type diffraction grating usable in the EUV exposure apparatus of this embodiment is not limited to one having the parameters such as described above. Only required is that the EUV light can be diffracted concentratedly at an angle or angles different from those of the infrared rays. More preferably, the infrared rays are made concentrated to zero-th and first orders, while the EUV light is made concentrated to an angle or angles between these orders. Since the wavelength of EUV light is about 1/50 to 1/500 of the wavelength of infrared rays, the diffraction order of the EUV light may preferably be a half of it, that is, from 25th to 250th.

Figure 9:
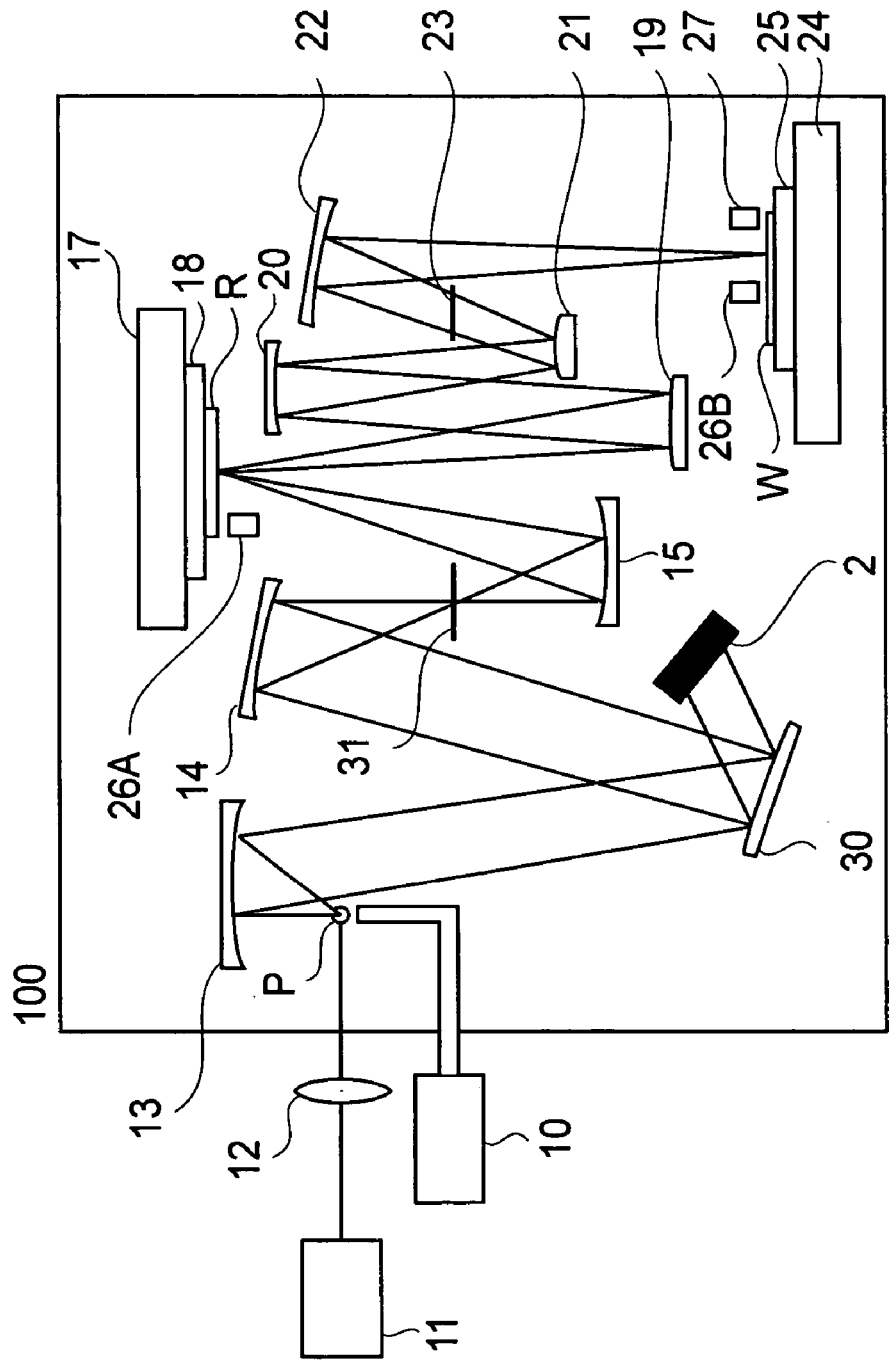
FIG. 9 is a schematic view of a main portion of an EUV exposure apparatus according to a fourth embodiment of the present invention.

Next, a fourth embodiment of the present invention will be explained. FIG. 9 is a schematic view of a main portion of an EUV exposure apparatus according to the fourth embodiment of the present invention. In FIG. 9, structural components corresponding to those of the EUV exposure apparatus shown in FIG. 4 are denoted by like numerals. In the first embodiment, a blaze type diffraction grating is disposed before an optical integrator, whereas in the fourth embodiment an optical integrator and a blaze type diffraction grating are made integral.

Figure 10A:
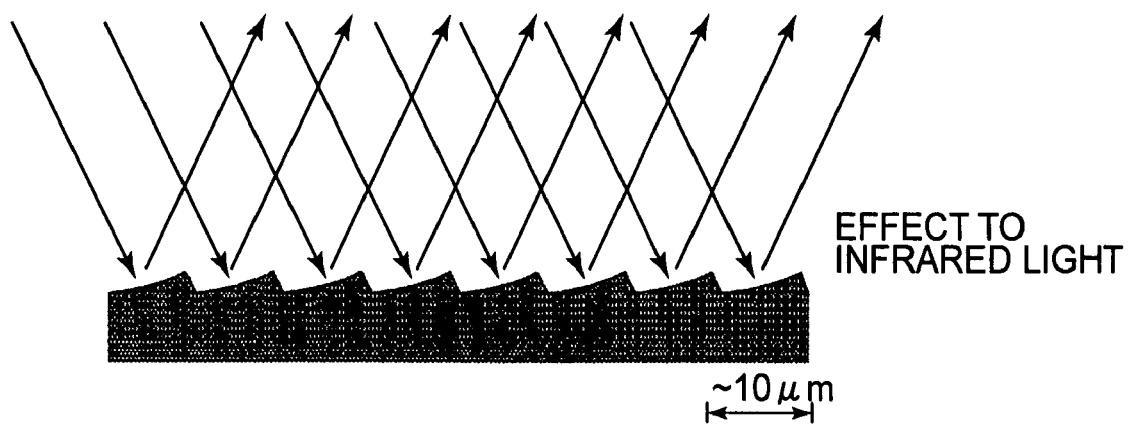
FIGS. 10A and 10B are schematic views, respectively, for explaining a blaze type diffraction grating optical integrator used in the fourth embodiment of the present invention.
Figure 10B:
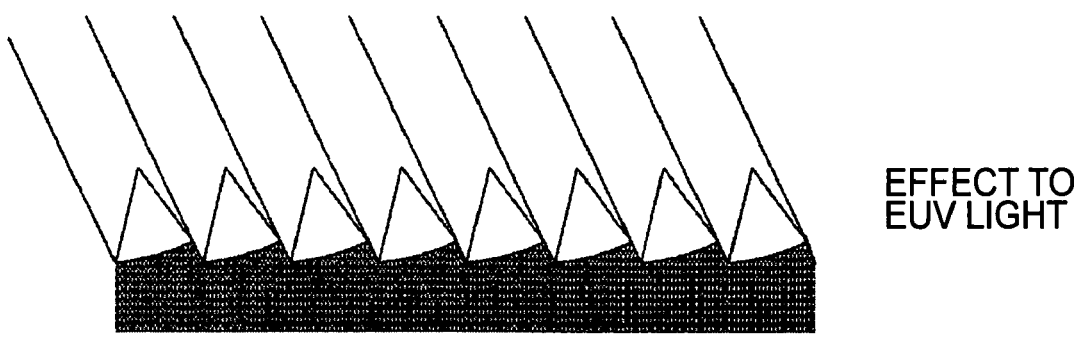

FIGS. 10A and 10B show a blaze diffraction grating type optical integrator 30 according to this embodiment. The optical integrator is an optical element in which a large number of very small reflection surfaces having a predetermined shape are arrayed along a flat plane or curved plane, to produce a large number of secondary light sources of exposure light to thereby make uniform the light intensity to be provided.

In the optical integrator of this embodiment, the shape of a unit grating of the blaze type diffraction grating structure is provided with a predetermined curvature, by which the function as an optical integrator is added to the blaze type diffraction grating.

Among the light rays incident on the reflection type optical integrator shown in FIG. 10A or 10B, EUV light can produce a large number of secondary light sources at a position very close to the reflection type optical integrator. Where this reflection type optical integrator is provided by concave mirrors, the secondary light sources are produced outside the reflection surface of the optical integrator. If the optical integrator is provided by convex mirrors, the secondary light sources are defined inside the integrator reflection surface.

Here, the diffraction grating groove pitch d of the blaze diffraction grating type optical integrator is 50 μm, and the blaze angle is 4 deg. For improved reflectance of the diffraction grating surface to the EUV light, a multilayered film comprising alternately accumulated molybdenum layers and silicon layers, is provided on the grating surface.

Figure 11:
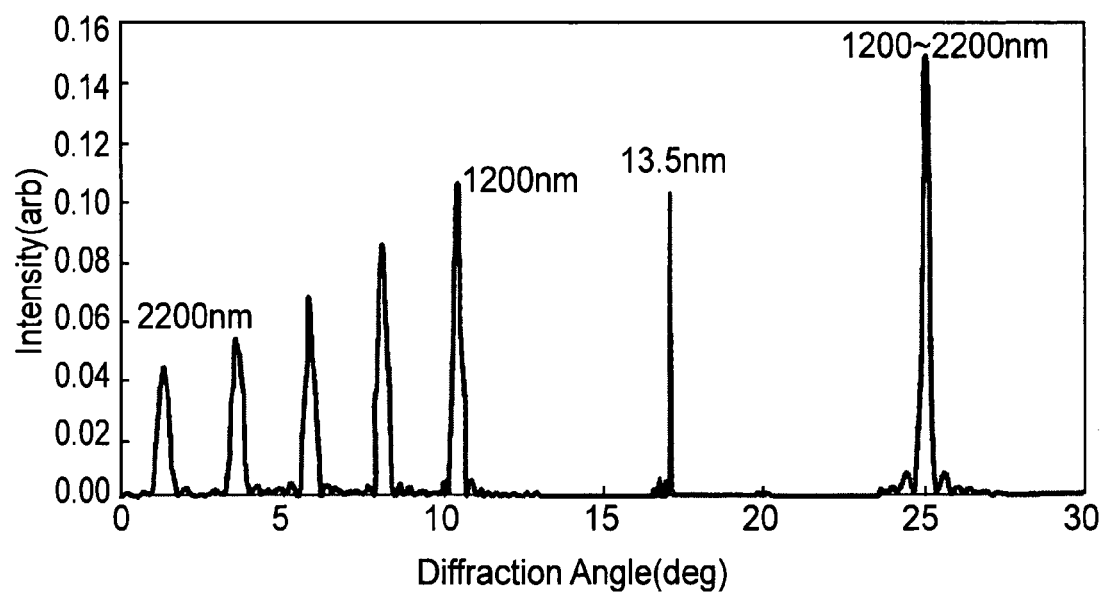
FIG. 11 is a graph for explaining angular distribution of diffraction light produced by a blaze type diffraction grating according to the fourth embodiment of the present invention.
Figure 12:
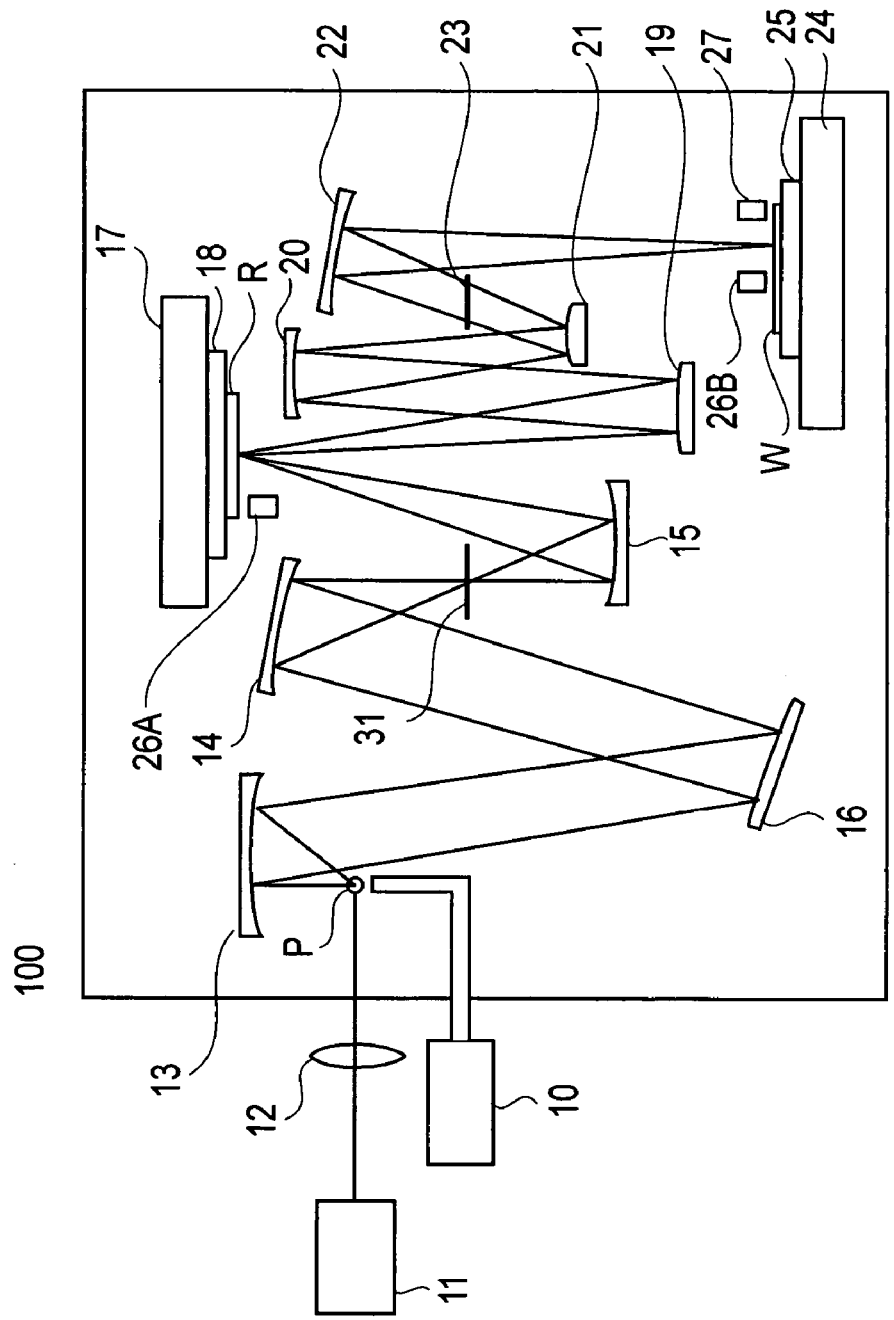
FIG. 12 is a schematic view of a known example of EUV exposure apparatus.

FIG. 11 illustrates the results of calculation made in regard to the angular distribution of diffraction light in a case where light that comprises a mixture of EUV light having a wavelength 13.5 nm and infrared rays of a wavelength 1200-2200 nm, is projected on the diffraction grating used in this embodiment. It is seen from FIG. 11 that the EUV light of 13.5 nm wavelength is diffracted with an angle of about 18 deg. This corresponds to a diffraction order of about 48th. On the other hand, the infrared rays of 1200-2200 nm wavelengths are concentrated to angles of 25 deg. and 0 to 11 deg. The former corresponds to zero-th order diffraction, while the latter corresponds to first order diffraction. Thus, with use of the blaze diffraction grating type optical integrator of this embodiment, the EUV light necessary for the exposure is diffracted in a direction of an angle 713 deg., and a large number of secondary light source can be produced adjacent the optical integrator. On the other hand, unwanted infrared rays unnecessary for the exposure are diffracted in directions of angles of 17 deg. and 10-4 deg., and they are separated out of the light path of EUV light. Furthermore, in this embodiment like the first embodiment, an infrared ray absorbing member or the like may be used to intercept the unwanted infrared rays.

The blaze diffraction grating type optical integrator usable in the EUV exposure apparatus of this embodiment is not limited to one having the parameters such as described above. Only required is that the EUV light can be diffracted concentratedly at an angle or angles different from those of the infrared rays. More preferably, the infrared rays are made concentrated to zero-th and first orders, while the EUV light is made concentrated to an angle or angles between these orders. Since the wavelength of EUV light is about 1/50 to 1/500 of the wavelength of infrared rays, the diffraction order of the EUV light may preferably be a half of it, that is, from 25th to 250th.

In the embodiments of the present invention as described hereinbefore, a plasma light source is used in an EUV exposure apparatus and light rays from the plasma light source are reflected by a blaze type diffraction grating having a predetermined structure. This enables extraction of EUV light from the produced light rays, separately from any other unwanted light rays. Thus, entrance of unwanted rays into an optical system of the exposure apparatus can be prevented effectively. Particularly, any undesirable decreases of positional precision in regard to a pattern to be transferred, due to heat application to a reticle or a wafer caused by infrared rays contained in the light rays from the plasma light source, can be prevented. Therefore, an EUV exposure apparatus or an EUV exposure method using the same by which a fine pattern can be transferred accurately and stably, can be accomplished by the present invention.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2004-116805 filed Apr. 12, 2004, for which is hereby incorporated by reference.

What is claimed is:

1. An exposure apparatus for exposing a substrate to a pattern of an original by use of extreme ultraviolet light, said apparatus comprising:

a blaze type diffraction grating disposed so that light from a plasma light source is incident thereon; and an optical system configured to direct extreme ultraviolet light diffracted by said blaze type diffraction grating and having largest diffraction intensity to at least one of the original and the substrate;

wherein said blaze type diffraction grating has a blaze angle which is set so that extreme ultraviolet light of a diffraction order having largest diffraction intensity is diffracted in a direction which is between diffraction lights of consecutive diffraction orders, which lights are in a wavelength region other than the extreme ultraviolet light, and wherein the diffraction order of the extreme ultraviolet light having largest diffraction intensity differs from the consecutive orders of the lights in the wavelength region other than the extreme ultraviolet light.

2. An apparatus according to claim 1, wherein said blaze type diffraction grating has a light entrance surface with a multilayered film effective to reflect extreme ultraviolet light.

3. An apparatus according to claim 1, wherein said blaze type diffraction grating has a light entrance surface with a reflection film which comprises one of metals of gold, platinum, molybdenum, ruthenium and rhodium, or an alloy of any ones of them.

4. An apparatus according to claim 1, wherein a unit shape of said blaze type diffraction grating has a curvature, such that said blaze type diffraction grating can function as an optical integrator.

5. An apparatus according to claim 1, wherein said blaze type diffraction grating is arranged so that extreme ultraviolet light is emitted in a direction of mirror reflection with respect to a unit shape of the grating structure of said blaze type diffraction grating and that light rays other than the extreme ultraviolet light are emitted in a direction different from the mirror reflection with respect to the unit shape of the grating structure of said blaze type diffraction grating.

6. An apparatus according to claim 1, wherein said blaze type diffraction grating is arranged to diffract light so that zero-th order diffraction light and first-order diffraction light among diffracted light rays, other than the extreme ultraviolet light, diffracted by said blazed type diffraction grating, are produced at the opposite sides of diffraction light of the extreme ultraviolet light, having a largest diffraction intensity.

7. An apparatus according to claim 1, further comprising a light-ray absorbing member for absorbing light rays other than diffracted extreme ultraviolet light, diffracted by said blaze type diffraction grating.

8. An apparatus according to claim 7, further comprising cooling means for cooling said light-ray absorbing member.

9. A device manufacturing method, comprising the steps of:

exposing a substrate to a pattern of an original by use of an exposure apparatus as set forth in claim 1; and developing the exposed substrate.

* * * * *